United States Patent
Tam et al.

(10) Patent No.: US 8,971,421 B2
(45) Date of Patent: Mar. 3, 2015

(54) MILLI-METER-WAVE-WIRELESS-INTERCONNECT (M2W2-INTERCONNECT) METHOD FOR SHORT-RANGE COMMUNICATIONS WITH ULTRA-HIGH DATA RATE CAPABILITY

(71) Applicant: The Regents of the University of California, Oakland, CA (US)

(72) Inventors: Sai-Wang Tam, Rosemead, CA (US); Mau-Chung F. Chang, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/456,922

(22) Filed: Aug. 11, 2014

(65) Prior Publication Data

US 2014/0369393 A1    Dec. 18, 2014

Related U.S. Application Data

(63) Continuation of application No. 13/377,124, filed as application No. PCT/US2010/038033 on Jun. 9, 2010, now Pat. No. 8,817,891.

(60) Provisional application No. 61/185,946, filed on Jun. 10, 2009.

(51) Int. Cl.
*H04L 27/00* (2006.01)
*H04B 5/00* (2006.01)
*H04B 5/02* (2006.01)

(52) U.S. Cl.
CPC .............. *H04B 5/0031* (2013.01); *H04B 5/02* (2013.01)

USPC ............ 375/256; 375/141; 375/219; 375/377

(58) Field of Classification Search
USPC ......... 375/141, 146, 147, 219, 220, 256, 257, 375/259, 260, 377
See application file for complete search history.

(56) References Cited

U.S. PATENT DOCUMENTS

| 6,556,330 | B2 | 4/2003 | Holcombe |
| 6,856,788 | B2 | 2/2005 | Chang et al. |

(Continued)

FOREIGN PATENT DOCUMENTS

| EP | 1988575 | 11/2008 |
| JP | 2005167475 | 6/2005 |
| JP | 2006295319 | 10/2006 |
| JP | 2008270787 | 11/2008 |

OTHER PUBLICATIONS

PCT International Search Report and Written Opinion dated Jan. 20, 2011 (Int'l Application No. PCT/US2010/038033).

(Continued)

*Primary Examiner* — Dac Ha
(74) *Attorney, Agent, or Firm* — Gates & Cooper LLP

(57) ABSTRACT

A millimeter wave wireless (M2W2) interconnect is used for transmitting and receiving signals at millimeter-wave frequencies for short-range wireless communication with high data rate capability. The transmitter and receiver antennae may comprise an on-chip differential dipole antenna or a bond-wire differential dipole antenna. The bond wire differential dipole antenna is comprised of a pair of bond wires connecting between a pair of pads on an integrated circuit (IC) die and a pair of floating pads on a printed circuit board (PCB).

26 Claims, 12 Drawing Sheets

(56) References Cited

U.S. PATENT DOCUMENTS

| | | | |
|---|---|---|---|
| 8,254,983 | B2 | 8/2012 | Rofougaran |
| 8,526,557 | B2 * | 9/2013 | Takeuchi ............... 375/356 |
| 2005/0117630 | A1 | 6/2005 | Kishi |
| 2006/0176861 | A1 | 8/2006 | Schmidt |
| 2007/0115816 | A1 | 5/2007 | Sinivaara |
| 2008/0214108 | A1 | 9/2008 | Beigne et al. |
| 2009/0075591 | A1 | 3/2009 | Murdoch et al. |
| 2009/0239483 | A1 | 9/2009 | Rofougaran |
| 2010/0231452 | A1 | 9/2010 | Babakhani et al. |
| 2011/0051780 | A1 | 3/2011 | Kawasaki |
| 2011/0075747 | A1 * | 3/2011 | Mihota ............... 375/260 |
| 2013/0215979 | A1 | 8/2013 | Yakovlev et al. |

OTHER PUBLICATIONS

Cao et al., "A 24-GHz Transmitter With On-Chip Dipole Antenna in 0.13-μm CMOS". IEEE Journal of Solid-State Circuits, vol. 43, No. 6, 2008, pp. 1394-1402.

Tam et al., "A Simultaneous Tri-band On-Chip RF-Interconnect for Future Network-on-Chip". Electrical Engineering Department, University of California Los Angeles, Appendix to U.S. Appl. No. 61/185,946, filed Jun. 10, 2009.

Japanese Office Action (with English translation) dated Feb. 28, 2014 for Japanese Patent Application No. 2012-515113.

* cited by examiner

MILLI-METER-WAVE-WIRELESS-INTERCONNECT (M2W2-INTERCONNECT) METHOD FOR SHORT-RANGE COMMUNICATIONS WITH ULTRA-HIGH DATA RATE CAPABILITY

CROSS REFERENCE TO RELATED APPLICATIONS

This application is a continuation under 35 U.S.C. Section 120 of co-pending and commonly-assigned:

U.S. Utility patent application Ser. No. 13/377,124, filed on Dec. 8, 2011, by Sai-Wang Tam and Mau-Chung F. Chang, entitled "MILLI-METER-WAVE-WIRELESS-INTERCONNECT (M2W2-INTERCONNECT) METHOD FOR SHORT-RANGE COMMUNICATIONS WITH ULTRA-HIGH DATA RATE CAPABILITY,", which application claims the benefit under 35 U.S.C. Section 365(c) of co-pending and commonly-assigned:

P.C.T. International Patent Application Serial No. PCT/US2010/038033, filed on Jun. 9, 2010, by Sai-Wang Tam and Mau-Chung F. Chang, entitled "MILLI-METER-WAVE-WIRELESS-INTERCONNECT (M2W2-INTERCONNECT) METHOD FOR SHORT-RANGE COMMUNICATIONS WITH ULTRA-HIGH DATA RATE CAPABILITY,", which application claims the benefit under 35 U.S.C. Section 119(e) of commonly-assigned:

U.S. Provisional Patent Application Ser. No. 61/185,946, filed on Jun. 10, 2009, by Sai-Wang Tam and Mau-Chung F. Chang, entitled "MILLI-METER-WAVE-WIRELESS-INTERCONNECT (M2W2-INTERCONNECT) METHOD FOR SHORT-RANGE COMMUNICATIONS WITH ULTRA-HIGH DATA RATE CAPABILITY,", all of which applications are incorporated by reference herein.

BACKGROUND OF THE INVENTION

1. Field of the Invention

This invention relates to a millimeter wave wireless (M2W2) interconnect method for short range communications with ultra-high data rate capability.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

On-chip interconnects, especially for multi-processor chips and network-on-a-chip, have been projected as the limiting factor in terms of bandwidth, power and latency. However, on-chip interconnects remain non-scalable and non-reconfigurable.

In previous work [1], an on-chip antenna was used for wireless data transmission with distance of 1 m or above. However, this on-chip antenna required the use of a phase and frequency synchronous modulation scheme, such as binary phase-shifted-keying (BPSK), which increased the complexity of the architecture and overall power consumption.

Thus, there is a need in the art for improved methods of wireless data transmission. The present invention satisfies that need.

SUMMARY OF THE INVENTION

To overcome the limitations in the prior art described above, and to overcome other limitations that will become apparent upon reading and understanding the present specification, the present invention discloses a millimeter wave wireless (M2W2) interconnect for transmitting and receiving signals at millimeter-wave frequencies for short-range wireless communication with high data rate capability, wherein the M2W2 interconnect is used with asynchronous modulation and differential signaling.

The M2W2 interconnect includes a transmitter for modulating a millimeter-wave carrier signal with an input data stream, wherein the modulated millimeter-wave carrier signal is amplified and then fed to a transmitter antenna and radiated. The M2W2 interconnect also includes a receiver for receiving the radiated millimeter-wave carrier signal at a receiver antenna, for amplifying the received millimeter-wave carrier signal, and for converting the amplified millimeter-wave carrier signal by demodulation to a full swing digital signal as an output data stream.

A differential-mutual-mixer in the receiver acts as an envelope detector and carrier removal is used to demodulate the millimeter-wave carrier signal to a base-band signal, wherein the base-band signal is amplified to the full swing digital signal.

The transmitter and receiver antennae may comprise an on-chip differential dipole antenna or a bond-wire dipole antenna. The bond wire dipole antenna is comprised of a pair of bond wires connecting between a pair of pads on an integrated circuit (IC) die and a pair of floating pads on a printed circuit board (PCB).

BRIEF DESCRIPTION OF THE DRAWINGS

Referring now to the drawings in which like reference numbers represent corresponding parts throughout:

FIGS. 5A-D illustrate a pair of bond wires as a dipole antenna, wherein FIG. 5A is a top view, FIG. 5B is a side view, FIG. 5C is a cross-section view and FIG. 5D is a three dimensional perspective view.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Disclosure

The present invention comprises a wireless interconnect for transmitting and receiving signals at specified frequencies for short-range communication with high data rate capability, comprising the M2W2 interconnect, where the specified frequencies are millimeter-wave frequencies, using an asynchronous modulation scheme and differential signaling architecture. The M2W2 interconnect transmits data wirelessly, in contrast to previous implementations of RF-I (radio frequency interconnects) that utilize a controlled-impedance transmission medium [2]. Moreover, the specified frequencies used with the M2W2 interconnect may be transmitted concurrently in a plurality of different frequency bands to implement multiple parallel communication links.

The present invention describes a transmitter for modulating a millimeter-wave carrier signal with an input data stream, wherein the modulated carrier signal is further amplified to a higher power level and then fed to a transmitter antenna that radiates the modulated carrier signal. The present invention also describes a receiver for receiving the radiated carrier signal at a receiver antenna, for amplifying the received carrier signal, and for converting the amplified carrier signal by demodulation to a base-band signal that is then amplified and output as a full swing digital signal comprising an output data stream. The transmitter and receiver use asynchronous modulation and differential signaling for communicating between integrated circuit (IC) chips or printed circuit boards (PCBs).

By choosing a millimeter-wave carrier signal, a higher carrier-to-data-rate ratio further minimizes the dispersion of the modulating signal and removes the need for a power hungry equalization circuit. Moreover, the size of the antenna is dramatically reduced in millimeter-wave frequencies, and in short-range communication applications, the design requirements of antenna such as antenna gain, directivity, radiation efficient, power matching, etc., are greatly relaxed.

Figure 1:
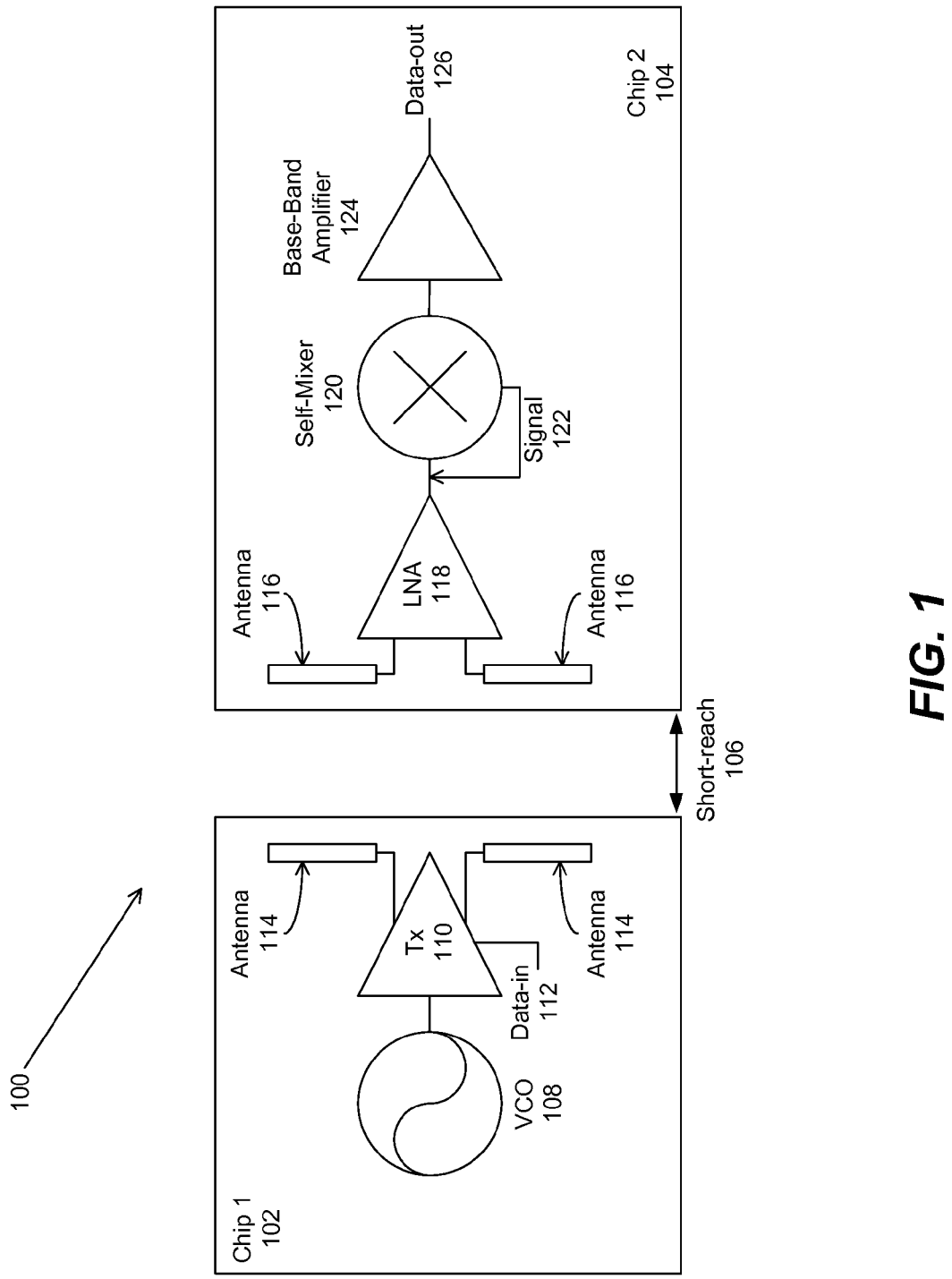
FIG. 1 is a schematic of a single channel wireless radio frequency interconnect (RF-I) using an on-chip antenna.
Figure 2:
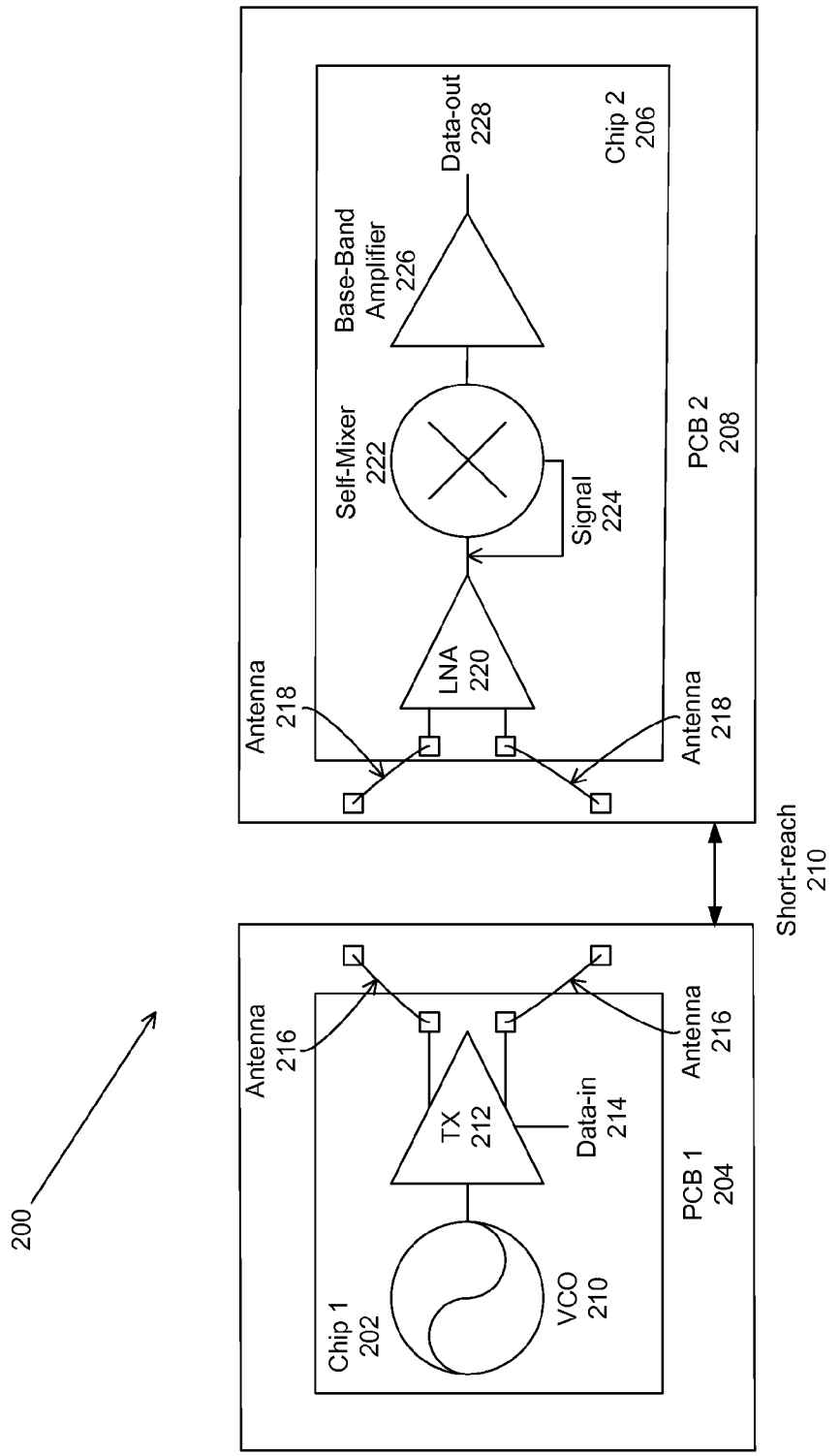
FIG. 2 is a schematic of a single channel wireless RF-I using a pair of bond wires as an antenna.

In the present invention, two configurations are proposed for the antenna for the short range M2W2 interconnect: an on-chip antenna and a bond-wire antenna. FIG. 1 is a schematic of a single channel wireless M2W2 interconnect using an on-chip differential dipole antenna, while FIG. 2 is a schematic of a single channel wireless M2W2 interconnect using a bond-wire dipole antenna.

The single channel wireless M2W2 interconnect 100 of FIG. 1 couples a first chip (Chip 1) 102 comprising a transmitter to a second chip (Chip 2) 104 comprising a receiver, wherein the first chip 102 is physically separated from the second chip 104 by a short reach or length 106. Asynchronous modulation and differential signaling is used for communicating between the integrated circuit (IC) chips or dies 102 and 104 on the same or different printed circuit boards (PCBs).

The first chip 102 includes a voltage-controlled oscillator (VCO) 108 for generating a radio frequency (RF) carrier signal, and a transmitter (Tx) 110 for modulating the RF carrier signal using a data-in signal 112 comprising an input data stream, wherein the modulated RF carrier signal is then fed to an on-chip differential dipole antennae 114 that radiates the modulated RF carrier signal.

The second chip 104 includes an on-chip differential dipole antenna 116 for receiving the radiated RF carrier signal, which is then fed into a low-noise amplifier (LNA) 118 to generate an amplified RF carrier signal. The amplified RF carrier signal is converted by demodulation at a self-mixer 120 by self-mixing the amplified RF carrier signal with itself 122 to generate a base-band signal. The base-band signal is amplified by a base-band amplifier 124 to generate a data-out signal 126 comprising an output data stream that is a full swing digital signal.

The single channel wireless M2W2 interconnect 200 of FIG. 2 couples a first chip (Chip 1) 202 comprising a transmitter on a first PCB 204 to a second chip (Chip 2) 206 comprising a receiver on a second PCB 208, wherein the first PCB 204 is physically separated from the second PCB 208 (and thus the first chip 202 is separated from the second chip 206) by a short reach or length 210. As with FIG. 1, asynchronous modulation and differential signaling is used for communicating between the integrated circuit chips 202 and 206 on the different PCBs 204 and 208.

The first chip 202 includes a voltage-controlled oscillator (VCO) 210 for generating a radio frequency (RF) carrier signal, and a transmitter (Tx) 212 for modulating the RF carrier signal using a data-in signal 214 comprising an input data stream, wherein the modulated RF carrier signal is then fed to a pair of bond-wire antennae 216 acting as a dipole antenna that radiates the modulated RF carrier signal.

The second chip 206 includes a pair of bond-wire antennae 218 acting as a dipole antenna for receiving the radiated RF carrier signal, which is then fed into a low-noise amplifier (LNA) 220 for generating an amplified RF carrier signal. The amplified RF carrier signal is converted by demodulation at a self-mixer 222 by self-mixing the amplified RF carrier signal with itself 224 to generate a base-band signal. The base-band signal is amplified by a base-band amplifier 226 to generate a data-out signal 228 comprising an output data stream that is a full swing digital signal.

Figure 3A:
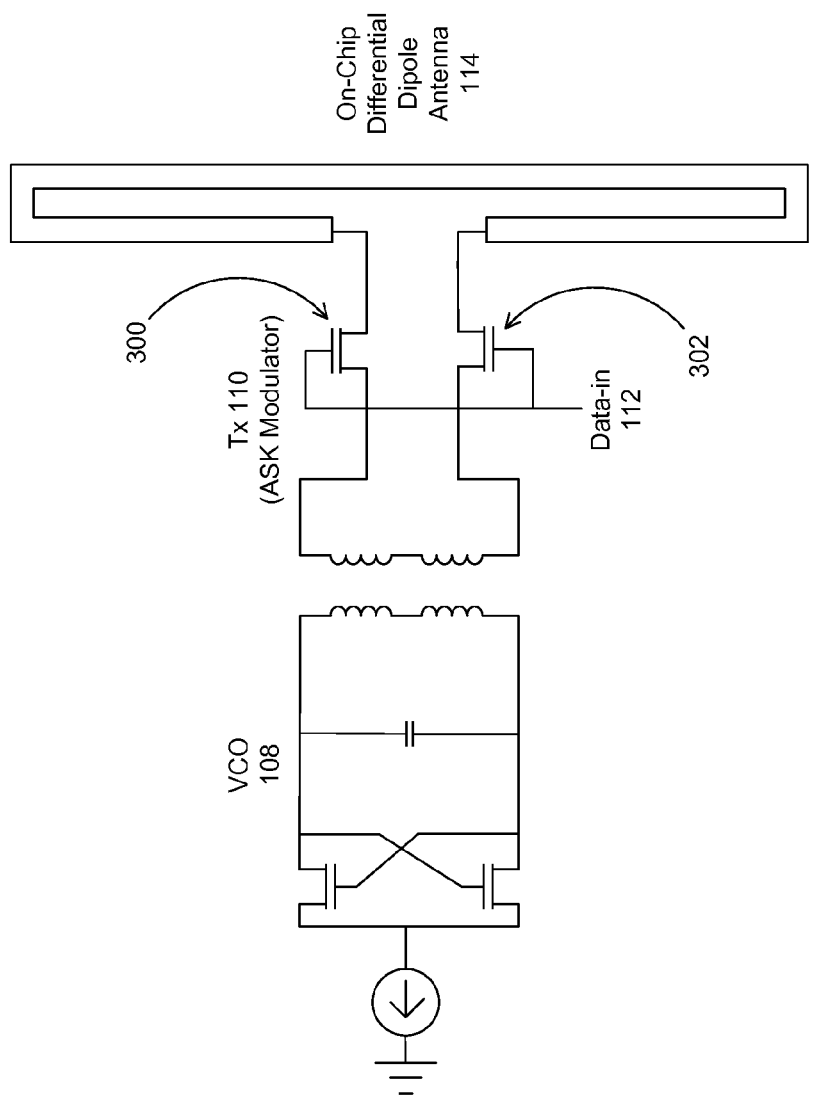
FIG. 3A is a schematic of a transmitter with an on-chip differential dipole antenna.
Figure 3B:
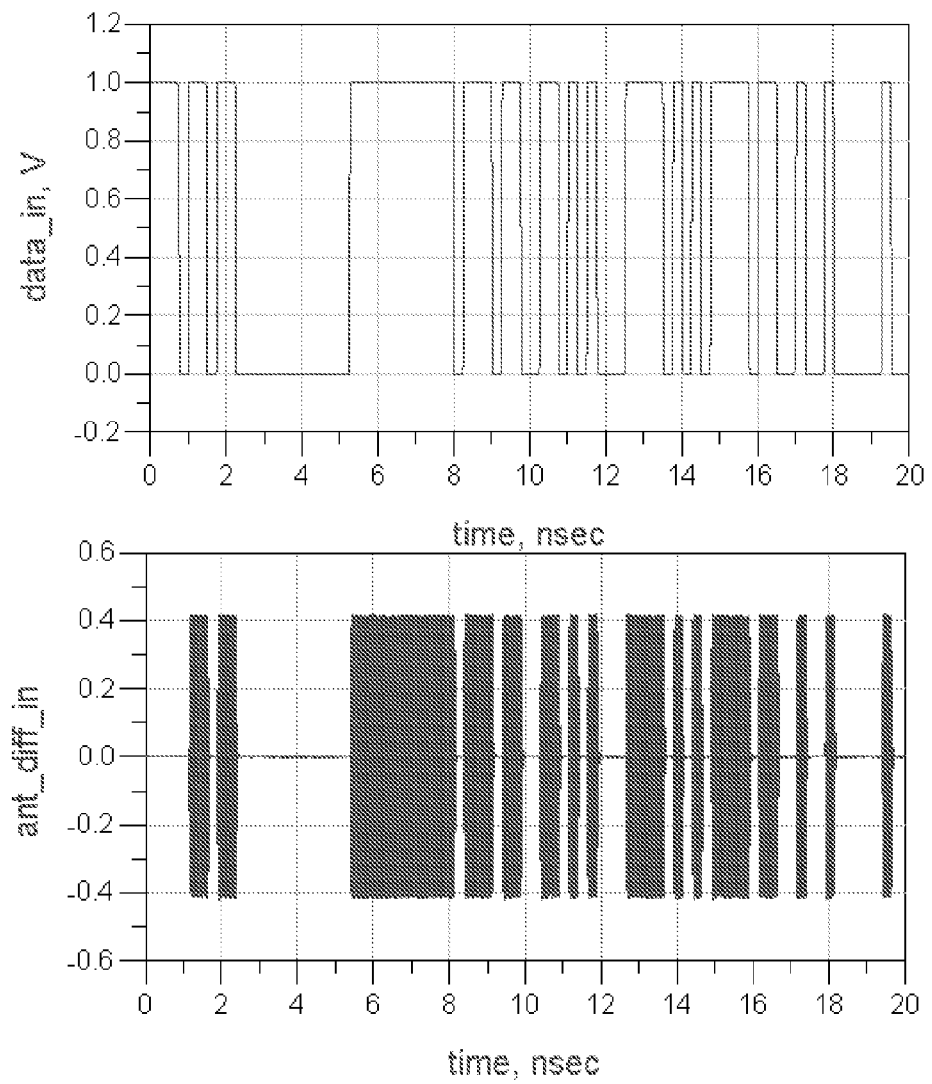
FIG. 3B comprises two graphs, wherein an upper graph shows the input data of an amplitude shift-keying (ASK) modulator and a lower graph shows the output data of the ASK modulator.

The first type of antenna configuration, comprising the on-chip differential dipole antennae 114 and 116 of FIG. 1, is further illustrated in FIGS. 3A and 3B. FIG. 3A is a schematic of the VCO 108, transmitter 110 and on-chip differential dipole antenna 114 from FIG. 1, and FIG. 3B comprises two graphs, wherein an upper graph shows the input data of an amplitude shift-keying (ASK) modulation performed by the transmitter 110 and a lower graph shows the output data of the ASK modulation performed by the transmitter 110.

The transmitter 110 implements the ASK modulation, which is an asynchronous modulation scheme, using a pair of on-off switches 300 and 302 that directly modulates the RF carrier signal using the data-in signal 112. The output of the transmitter 110 is then fed to the antenna 114 without any further amplification.

Unlike other synchronous modulation schemes, such as binary-phase shift-keying (BPSK), the receiver in the asynchronous ASK modulation system only detects changes in amplitude of the RF carrier signal, but does not detect changes in phase or frequency variations of the RF carrier signal. Therefore, the receiver can operate asynchronously without a power hungry phase lock loop (PLL).

ASK modulation also eliminates the need for RF carrier signal regeneration at the receiver by using a differential circuit architecture and a differential-mutual-mixing technique to automatically remove the RF carrier signal with no additional components required. Consequently, the M2W2 interconnect does not suffer from process-induced carrier variations between the transmit (Tx) and receive (Rx) functions.

The differential dipole antenna 114 is able is boost the input impedance, which provides better power matching between the ASK modulation of the transmitter 110 and the antenna 114. Moreover, this design using an on-chip antenna 114 eliminates the need to have any packaging operating in millimeter-wave frequencies and electrostatic discharge (ESD) protection circuits.

Figure 4:
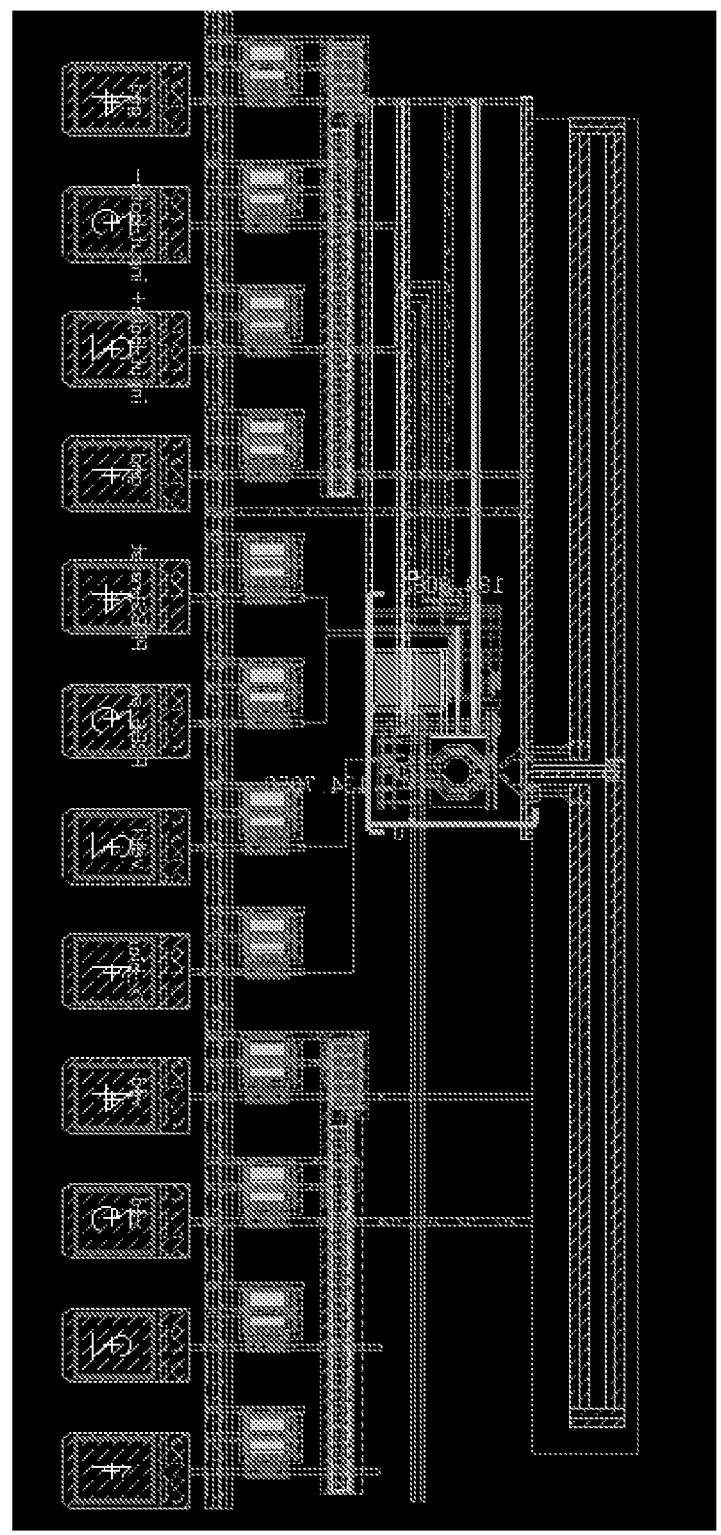
FIG. 4 is a layout of a transmitter with an on-chip differential dipole antenna.

FIG. 4 shows the layout of an exemplary ASK RF-I transmitter according to the present invention, wherein the transmitter is implemented using an IBM 90 nm process, and the die size is 1200 µm×500 µm.

Figure 5A:
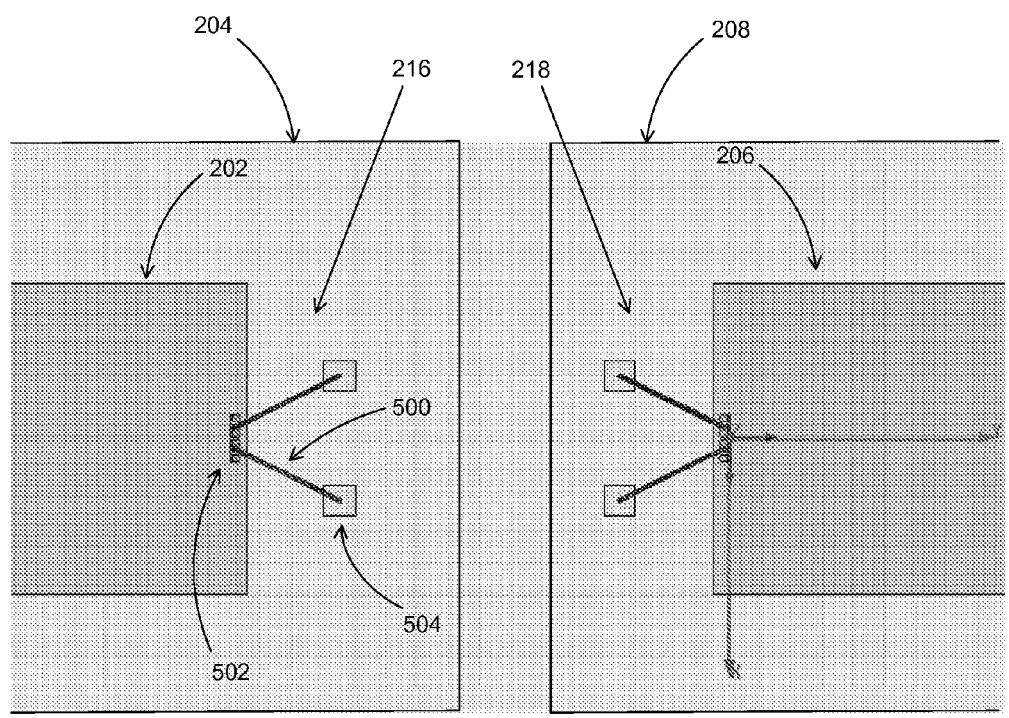
Figure 5B:
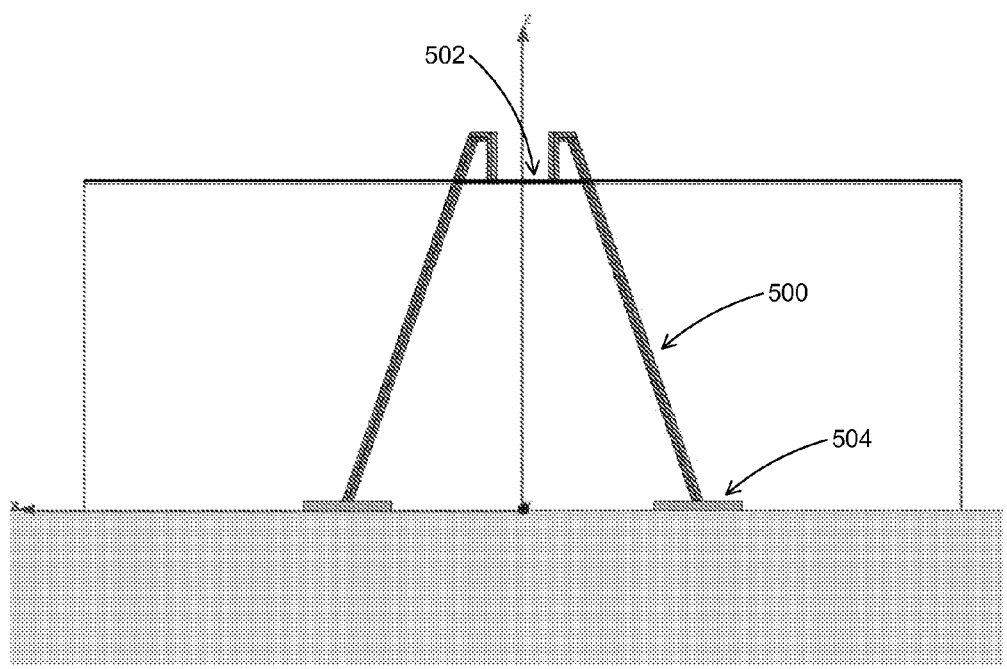
Figure 5C:
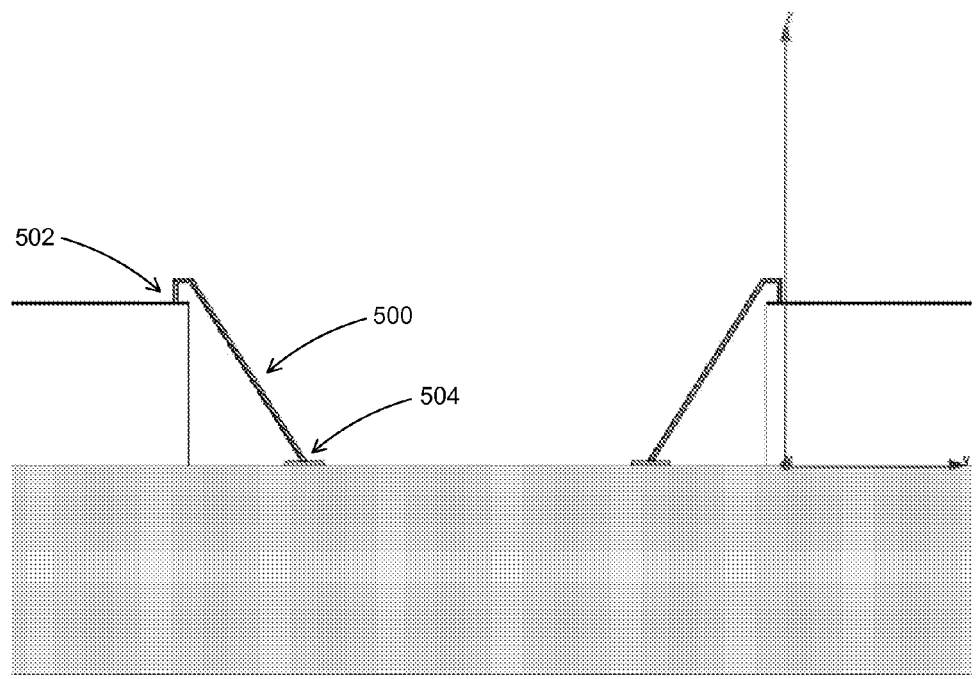
Figure 5D:
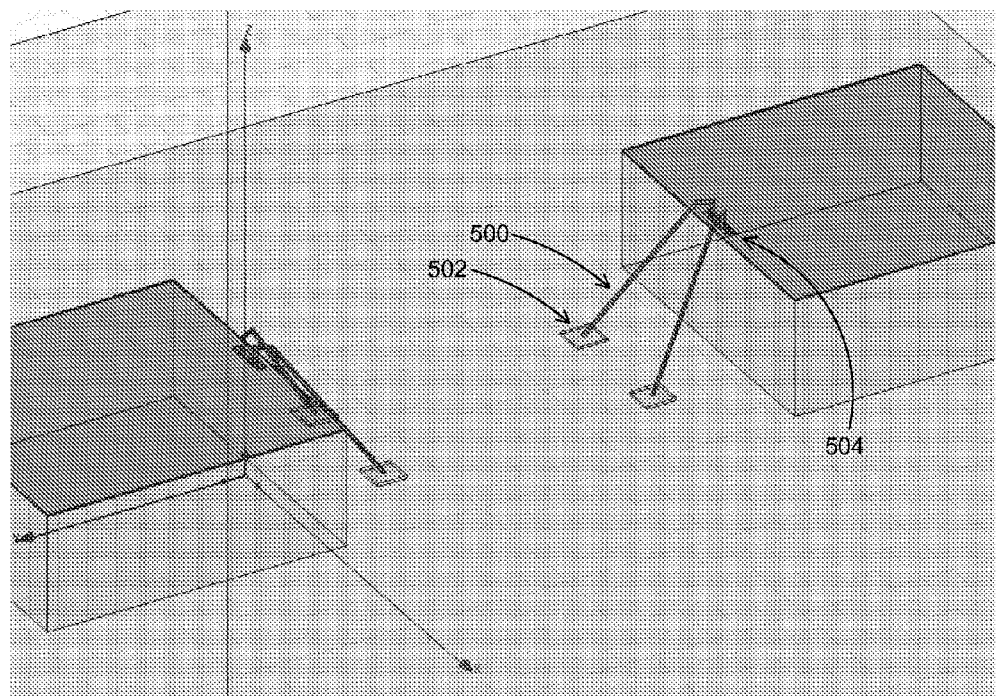

The second type of antenna configuration, comprising the pairs of bond-wire dipole antennae 216, 218 of FIG. 2, is further illustrated in FIGS. 5A, 5B, 5C and 5D, wherein FIG. 5A is a top view, FIG. 5B is a side view, FIG. 5C is a cross-section view and FIG. 5D is a three dimensional perspective view. Each bond-wire dipole antennae 216, 218 is comprised of a pair of bond wires 500 connecting between a pair of pads 502 on an IC chip or die 202, 206 mounted on a PCB 204, 208, and a pair of floating pads 504 on a PCB 204, 208. Mounting the bond wires 500 to a pair of floating pads 504 on the PCB 204, 208 can stabilize the physical shape of the antenna 216, 216. Moreover, the IC chip or die 202, 206 thickness may be controlled to match the optimum antenna length for millimeter-wave frequency operations.

Figure 6A:
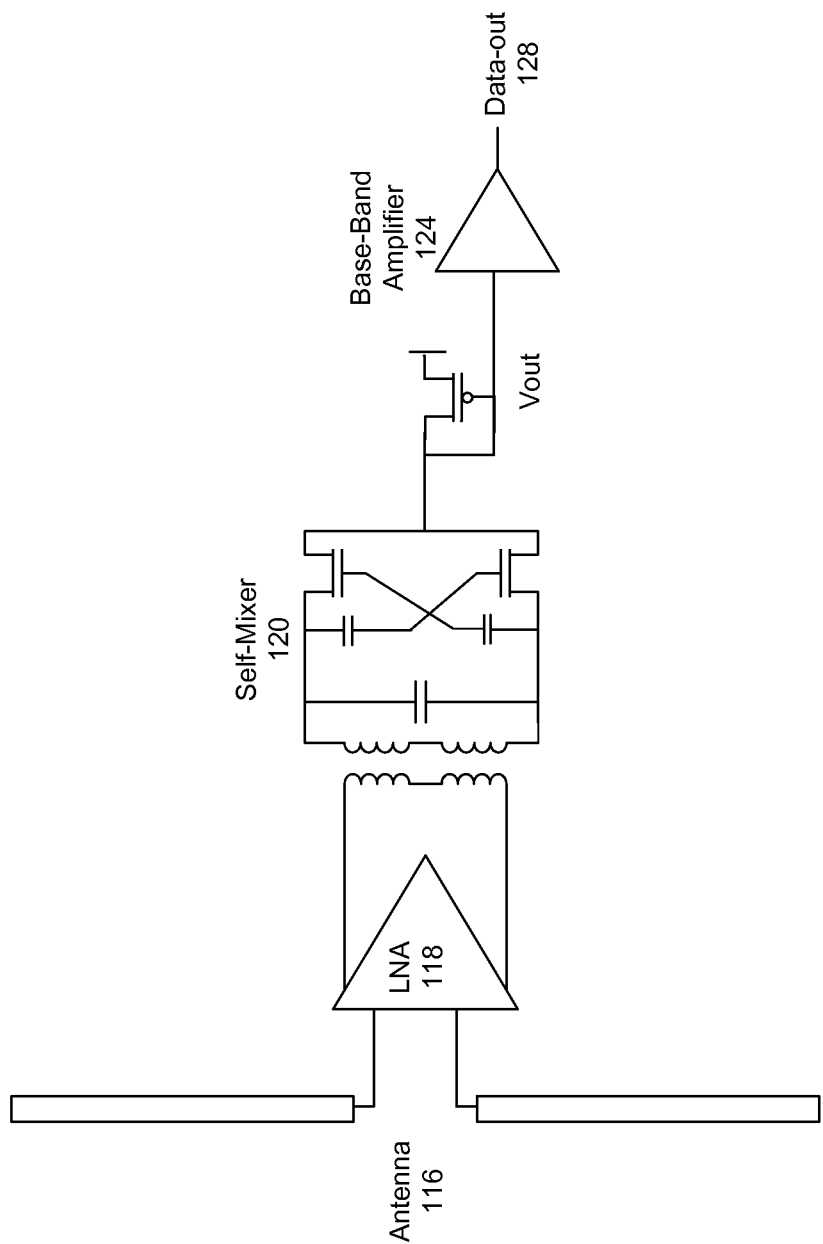
FIG. 6A is a schematic of a receiver with an on-chip dipole antenna.
Figure 6B:
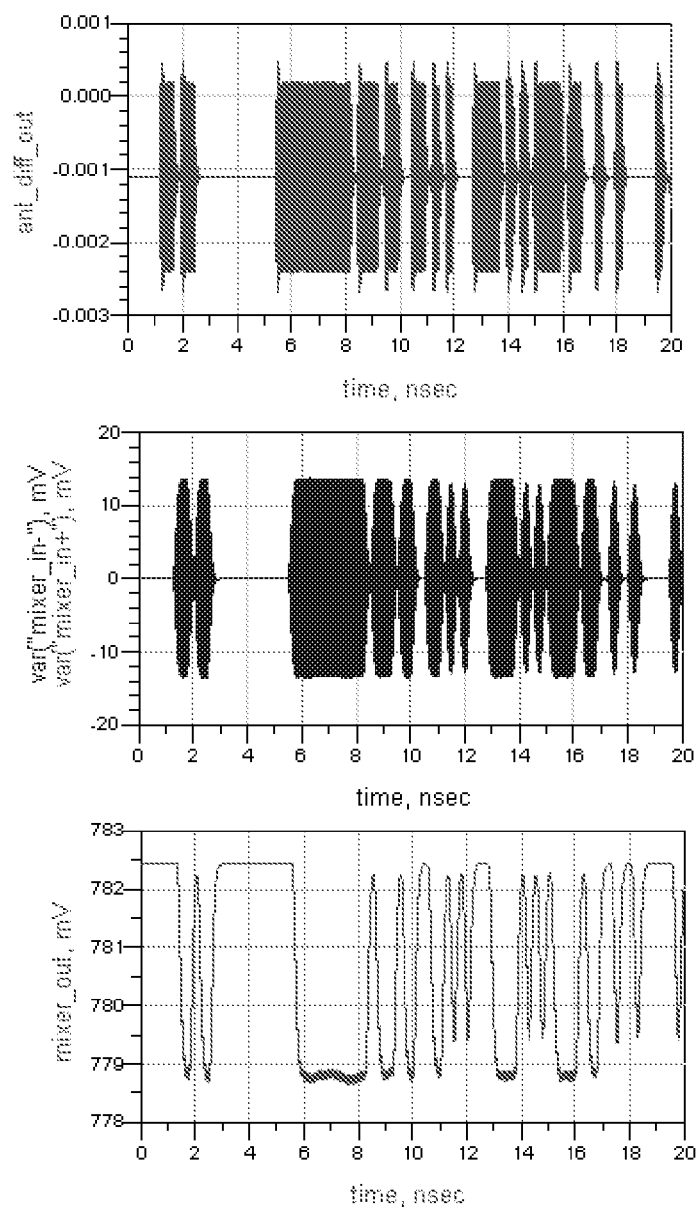
FIG. 6B comprises three graphs, wherein a upper graph shows the on-chip antenna first receiving a weak ASK signal, the middle graph shows the low noise amplifier amplifying the ASK signal so that that the self-mixer can demodulate the modulated signal to a base-band digital signal, as shown in the lower graph.

FIG. 6A is a schematic of a receiver with an on-chip differential dipole antenna, and FIG. 6B comprises three graphs, wherein a upper graph shows the on-chip antenna first receiving a weak ASK signal, the middle graph shows the low noise amplifier amplifying the ASK signal so that that the self-mixer can demodulate the modulated signal to a base-band digital signal, as shown in the lower graph.

On the receiver side, as shown in FIG. 6A, depending on the application and communication distance, the low noise amplifier 118 may be added to amplify the received RF carrier signal to boost the sensitivity of the receiver. In ASK RF-I, the bandwidth of the low noise amplifier 118 is adjusted to sufficiently support a many 10's of Gbps data rate, i.e., at microwave frequencies, in contrast to previous RF interconnects that cannot operate at microwave frequencies. A differential common source with a transformer coupling LNA architecture is suitable with such wide band applications.

As shown in FIGS. 6A and 6B, the self-mixer 120 may comprise a differential-mutual-mixer that acts as an envelope detector and carrier removal is used to demodulate the ASK-modulated millimeter-wave carrier signal to a base-band signal. After the differential-mutual-mixer 120, the demodulated base-band signal is then further amplified at 124 to a full swing digital signal 128.

Figure 7:
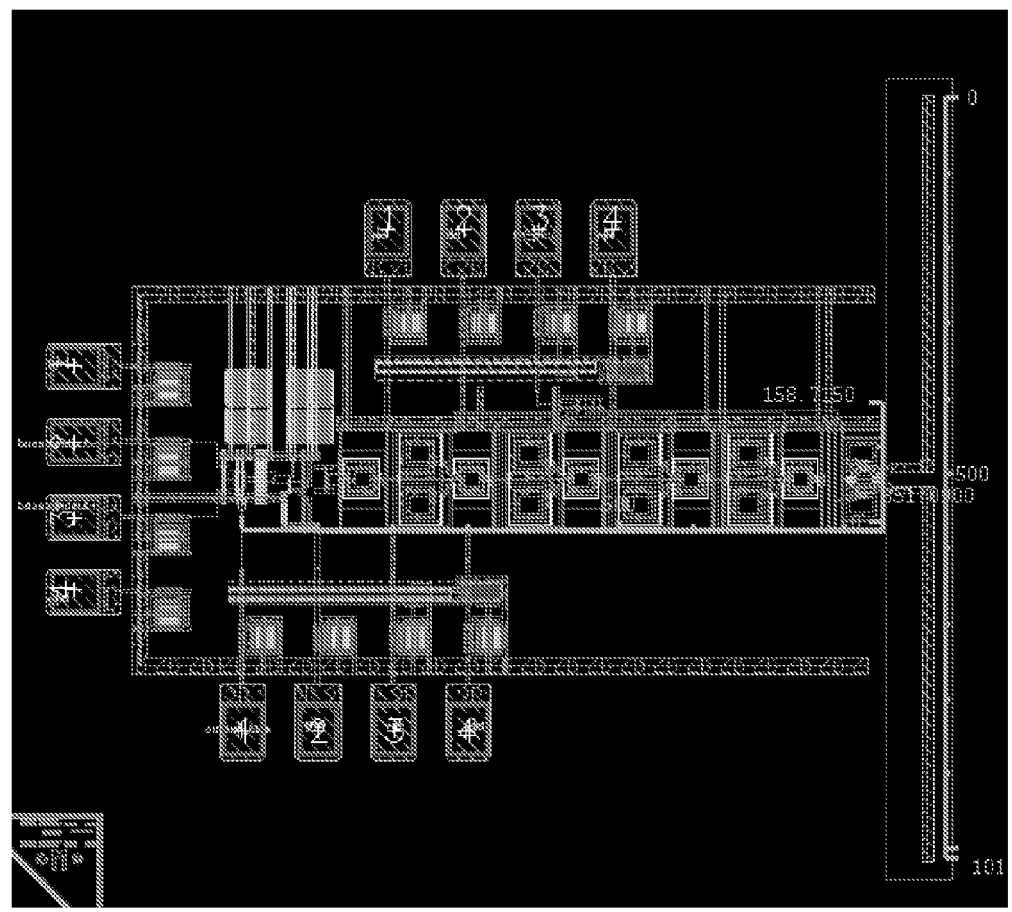
FIG. 7 is a layout of a receiver with an on-chip dipole antenna.

FIG. 7 shows the layout of an exemplary ASK RF-I receiver according to the present invention, wherein the receiver is implemented using an IBM 90 nm process, and the die size is 1200 µm×1000 µm.

Note that the present invention is preferably implemented in high-performance CMOS process technologies. Gate lengths of 90 nm and smaller are required to obtain sufficient transistor gain at carrier rates of 60 GHz and above. Typical implementations will be monolithic semiconductor die for the Tx and Rx functions, respectively. These Tx and Rx chips would be located at the endpoint of a physical signal transmission path, typically on one or more PCBs.

Advantages

The present invention provides a number of advantages over previous techniques, including:

Ultra-High Data Rate: Data rates as high as many tens of Gbps is possible because of the high carrier frequency of the present invention.

Low Power: Low power results because the present invention eliminates carrier regeneration at the receiver, and eliminates the need for power-hungry PLL circuitry from the receiver.

Scalable: As CMOS technology continues scaling, higher modulation rates will be possible.

Asynchronous Operation: The ASK modulation scheme is insensitive to process variations that would compromise the operation of a PLL based design.

In summary, the present invention offers a highly manufacturable solution for low cost short-reach wireless communication links. Alternative approaches would suffer from lower process yield and higher operating power, and therefore be a less competitive solution.

REFERENCES

The following references are incorporated by reference herein.

[1] Changhua Cao, et al., "A 24-GHz Transmitter With On-Chip Dipole Antenna in 0.13-µm CMOS," IEEE Journal of Solid-State Circuits, Vol. 43, No. 6, June 2008.

[2] U.S. Pat. No. 6,856,788, issued Feb. 15, 2005, to Mau-Chung F. Chang, Tatsuo Itoh, Yongxi Qian, Kang L. Wang, and entitled "Wireless IC Interconnection Method and System."

[3] Sai-Wang Tam, Eran Socher, Alden Wong and Mau-Chung Frank Chang, "A Simultaneous Tri-band On-Chip RF-Interconnect for Future Network-on-Chip," Appendix to U.S. Provisional Patent Application Ser. No. 61/185,946, filed on Jun. 10, 2009, by Sai-Wang Tam and Mau-Chung F. Chang, entitled "MILLI-METER-WAVE-WIRELESS-INTERCONNECT (M2W2-INTERCONNECT) METHOD FOR SHORT-RANGE COMMUNICATIONS WITH ULTRA-HIGH DATA RATE CAPABILITY,".

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A wireless interconnect for transmitting and receiving signals at specified frequencies for short-range communication with high data rate capability, comprising:

a transmitter for modulating a carrier signal with an input data stream, wherein the modulated carrier signal is then fed to a transmitter antenna that radiates the modulated carrier signal; and a receiver for receiving the radiated carrier signal at a receiver antenna and for converting the received carrier signal to a full swing digital signal as an output data stream;

wherein the transmitter and receiver use asynchronous modulation and differential signaling for communicating between integrated circuit chips or printed circuit boards; and wherein the receiver only detects changes in amplitude of the carrier signal and does not detect changes in phase or frequency variations of the carrier signal, and thus the receiver operates asynchronously without a phase-lock loop, while eliminating any need for carrier signal regeneration.

2. The wireless interconnect of claim 1, wherein the wireless interconnect is a millimeter wave wireless (M2W2) interconnect and the specified frequencies are millimeter-wave frequencies.

3. The wireless interconnect of claim 2, wherein the modulated carrier signal is a millimeter-wave carrier signal.

4. The wireless interconnect of claim 1, wherein the specified frequencies are transmitted concurrently in a plurality of different frequency bands to implement multiple parallel communication links.

5. The wireless interconnect of claim 1, wherein the transmitter or receiver antenna comprises an on-chip differential dipole antenna.

6. The wireless interconnect of claim 1, wherein the transmitter or receiver antenna comprises a bond-wire dipole antenna.

7. The wireless interconnect of claim 6, wherein the bond-wire dipole antenna is comprised of a pair of bond wires connecting between a pair of pads on a integrated circuit (IC) die mounted on a printed circuit board (PCB) and a pair of floating pads on the PCB.

8. The wireless interconnect of claim 1, wherein the transmitter includes a voltage-controlled oscillator that generates the carrier signal.

9. The wireless interconnect of claim 1, wherein the transmitter includes an amplitude-shift keying (ASK) modulator in which a pair of on-off switches directly modulates the carrier signal using the input data stream.

10. The wireless interconnect of claim 1, wherein the modulated carrier signal is amplified by the transmitter before being radiated by the transmitter antenna.

11. The wireless interconnect of claim 1, wherein the received carrier signal is amplified by the receiver after being received by the receiver antenna.

12. The wireless interconnect of claim 1, wherein the receiver includes a self-mixer comprising a differential-mutual-mixer that acts as an envelope detector and converts the received carrier signal by demodulating the received carrier signal to a base-band signal.

13. The wireless interconnect of claim 12, wherein the base-band signal is amplified to the full swing digital signal.

14. A method for transmitting and receiving signals at specified frequencies for short-range communication with high data rate capability using a wireless interconnect, comprising:
modulating, in a transmitter, a carrier signal with an input data stream, wherein the modulated carrier signal is then fed to a transmitter antenna that radiates the modulated carrier signal; and
receiving, in a receiver, the radiated carrier signal at a receiver antenna and for converting the received carrier signal to a full swing digital signal as an output data stream;
wherein asynchronous modulation and differential signaling are used in the transmitter and receiver for communicating between integrated circuit chips or printed circuit boards; and
wherein the receiver only detects changes in amplitude of the carrier signal and does not detect changes in phase or frequency variations of the carrier signal, and thus the receiver operates asynchronously without a phase-lock loop, while eliminating any need for carrier signal regeneration.

15. The method of claim 14, wherein the wireless interconnect is a millimeter wave wireless (M2W2) interconnect and the specified frequencies are millimeter-wave frequencies.

16. The method of claim 14, wherein the modulated carrier signal is a millimeter-wave carrier signal.

17. The method of claim 14, wherein the specified frequencies are transmitted concurrently in a plurality of different frequency bands to implement multiple parallel communication links.

18. The method of claim 14, wherein the transmitter or receiver antenna comprises an on-chip differential dipole antenna.

19. The method of claim 14, wherein the transmitter or receiver antenna comprises a bond-wire dipole antenna.

20. The method of claim 19, wherein the bond-wire dipole antenna is comprised of a pair of bond wires connecting between a pair of pads on a integrated circuit (IC) die mounted on a printed circuit board (PCB) and a pair of floating pads on the PCB.

21. The method of claim 14, wherein the transmitter includes a voltage-controlled oscillator that generates the carrier signal.

22. The method of claim 14, wherein the transmitter includes an amplitude-shift keying (ASK) modulator in which a pair of on-off switches directly modulates the carrier signal using the input data stream.

23. The method of claim 14, wherein the modulated carrier signal is amplified by the transmitter before being radiated by the transmitter antenna.

24. The method of claim 14, wherein the received carrier signal is amplified by the receiver after being received by the receiver antenna.

25. The method of claim 14, wherein the receiver includes a self-mixer comprising a differential-mutual-mixer that acts as an envelope detector and converts the received carrier signal by demodulating the received carrier signal to a base-band signal.

26. The method of claim 25, wherein the base-band signal is amplified to the full swing digital signal.

* * * * *